(12) United States Patent
Zhang et al.

(10) Patent No.: US 9,589,650 B2
(45) Date of Patent: Mar. 7, 2017

(54) CIRCUIT FOR ERASING DATA

(71) Applicant: Shanghai Huahong Grace Semiconductor Manufacturing Corporation, Shanghai (CN)

(72) Inventors: Yong Zhang, Shanghai (CN); Jun Xiao, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 14/974,379

(22) Filed: Dec. 18, 2015

(65) Prior Publication Data

US 2016/0189781 A1 Jun. 30, 2016

(30) Foreign Application Priority Data

Dec. 30, 2014 (CN) .......................... 2014 1 0857361

(51) Int. Cl.
| | |
|---|---|
| *G11C 16/04* | (2006.01) |
| *G11C 16/14* | (2006.01) |
| *G11C 5/14* | (2006.01) |
| *G11C 16/30* | (2006.01) |
| *G11C 16/28* | (2006.01) |

(52) U.S. Cl.
CPC .............. *G11C 16/14* (2013.01); *G11C 5/145* (2013.01); *G11C 5/147* (2013.01); *G11C 16/0408* (2013.01); *G11C 16/28* (2013.01); *G11C 16/30* (2013.01)

(58) Field of Classification Search
CPC ......... G11C 16/14; G11C 16/30; G11C 16/28; G11C 16/0408; G11C 5/145; G11C 5/147
See application file for complete search history.

(56) References Cited

U.S. PATENT DOCUMENTS

| | | | |
|---|---|---|---|
| 2011/0182125 A1* | 7/2011 | Itoh ......................... | G11C 16/30 365/185.33 |
| 2012/0002485 A1* | 1/2012 | Suwa ...................... | G11C 16/10 365/185.29 |
| 2012/0105036 A1* | 5/2012 | Midorikawa .......... | G11C 16/30 323/282 |
| 2012/0106255 A1* | 5/2012 | Midorikawa .......... | G11C 16/30 365/185.18 |
| 2015/0092497 A1* | 4/2015 | Tsai ....................... | G11C 5/147 365/185.21 |

\* cited by examiner

*Primary Examiner* — Toan Le
(74) *Attorney, Agent, or Firm* — Harness, Dickey & Pierce, P.L.C.

(57) ABSTRACT

A circuit for erasing data includes: a high voltage generation unit, adapted for generating an erasing signal; a first control unit, adapted for modifying the erasing signal to a first conduction control signal with a decreased voltage ascending speed; a second control unit, adapted for sending a second conduction control signal based on the first conduction control signal; a lift unit, adapted for lifting an output voltage for erasing data based on the first conduction control signal; a switch unit, adapted for forming an electrical access between the high voltage generation unit and the output end of the circuit for erasing data; and a reference current generation unit, adapted for providing a bias current to the first control unit and the second control unit. Under a circumstance that erasing effect of storage units is improved, area of a chip is relatively reduced by using the circuit for erasing data.

12 Claims, 2 Drawing Sheets

CIRCUIT FOR ERASING DATA

CROSS-REFERENCE TO RELATED APPLICATIONS

The present application claims priority to Chinese patent application No. 201410857361.8, filed on Dec. 30, 2014, and entitled "CIRCUIT FOR ERASING DATA", the entire disclosure of which is incorporated herein by reference.

TECHNICAL FIELD

The present disclosure generally relates to integrated circuit design technology, and more particularly, to a circuit for erasing data.

BACKGROUND

Non-transitory storage devices, including flash memories, Electrically Erasable Read-Only Memories (EEROMs), etc., are storage chips which won't lose data after they are powered off. In order to repeatedly utilize storage space of storage units in the non-transitory storage devices, data in the storage units is required to be erased in advance, and then, new data can be written into the storage units. A typical structure of storage units in a non-transitory storage device is configured as a matrix constituted of word lines along a row direction and bit lines along a column direction. When performing data erasing operations, by applying a data erasing voltage to the word lines, which is generally from 10V to 15V, data in the storage units corresponding to the word lines is erased.

When performing data erasing operations, in order to avoid breakdown of tunneling oxide layers of the storage units, it is required that the data erasing voltage applied on the word lines reaches around 12V after 200 µs. Accordingly, a climbing signal generation circuit is needed, so as to convert a high voltage erasing signal output from a charge pump into a voltage control signal with a relatively slow ascending speed.

In the climbing signal generation circuit, a startup voltage for a high voltage conduction tube coupled to the word lines becomes greater along with the increase of data erasing operations, leading to a drop of a maximum voltage output to the word lines, which affects the erasing effect. Conventionally, the erasing effect is improved by raising the voltage of the high voltage erasing signal. However, in this case, area of a high voltage generation unit generating the erasing signal is apparently enlarged, so that area occupied by the entire circuit is enlarged greatly.

SUMMARY

Embodiments of the present disclosure aim to relatively reduce the chip area under a circumstance that erasing effect of storage units is improved.

In order to solve the aforementioned problem, embodiments of the present disclosure provide a circuit for erasing data, which may include:

a high voltage generation unit, adapted for generating an erasing signal;

a first control unit, adapted for modifying the erasing signal to a first conduction control signal with a decreased voltage ascending speed;

a second control unit, adapted for sending a second conduction control signal based on the first conduction control signal, when the first conduction control signal resides in a first signal period, voltage of the second conduction control signal is identical to that of the erasing signal; and when the first conduction control signal resides in a second signal period, the voltage of the second induction control signal drops, where voltage of the first conduction control signal is less in the first signal period than in the second signal period;

a lift unit, adapted for lifting an output voltage at an output end of the circuit for erasing data based on the first conduction control signal;

a switch unit, adapted for, based on the second conduction control signal, forming an electrical access between the high voltage generation unit and the output end of the circuit for erasing data; and a reference current generation unit, adapted for providing a bias current to the first control unit and the second control unit.

In some embodiments, when the first conduction control signal resides in the first signal period, the voltage of the second conduction control signal is identical to that of the erasing signal, such that the switch unit is switched off, and the output voltage of the circuit provided by the lift unit has a voltage ascending speed slower than that of the erasing signal.

In some embodiments, when the first conduction control signal resides in the second signal period, the voltage of the second conduction control signal drops, such that the switch unit is switched on to form the electrical access between the high voltage generation unit and the output end of the circuit.

In some embodiments, the lift unit may include a first NMOS transistor, wherein a gate of the first NMOS transistor forms a control end of the lift unit, a source of the first NMOS transistor is coupled with the output end of the circuit for erasing data, and a drain of the first NMOS transistor is coupled with the high voltage generation unit.

In some embodiments, the switch unit may include a first PMOS transistor, wherein a gate of the first PMOS transistor forms a control end of the switch unit, a source of the first PMOS transistor is coupled with the output end of the circuit for erasing data, and a drain of the first PMOS transistor is coupled with the high voltage generation unit.

In some embodiments, the first control unit may include:

a reference current input sub-unit, adapted for receiving a bias current generated by the reference current generation unit;

a current mirror sub-unit, adapted for mirroring the bias current to a small current; and a first modification sub-unit, adapted for generating the first conduction control signal based on the small current.

In some embodiments, the current mirror sub-unit may include a second PMOS transistor and a third PMOS transistor, wherein a source of the second PMOS transistor is coupled with the high voltage generation unit, a gate of the second PMOS transistor is coupled with a gate of the third PMOS transistor, a drain of the second PMOS transistor and the reference current input sub-unit, wherein a source of the third PMOS transistor is coupled with the high voltage generation unit, a drain of the third PMOS transistor is coupled with the first modification sub-unit and the control end of the lift unit.

In some embodiments, the reference current input sub-unit may include a second NMOS transistor, wherein a gate of the second NMOS transistor is coupled with the reference current generation unit, a source of the second NMOS transistor is grounded, and a drain of the second NMOS transistor is coupled with the drain of the second PMOS transistor.

In some embodiments, the first modification sub-unit may include a first capacitor, where a first end of the first capacitor is coupled with the drain of the third PMOS transistor and a second end of the first capacitor is grounded.

In some embodiments, the small current flows from the third PMOS transistor to the first end of the first capacitor, so as to charge the first capacitor, during the charging process, voltage applied to the first end of the first capacitor gradually ascends, which forms the first conduction control signal.

In some embodiments, the second control unit may include:

a conduction control tube, adapted for forming an electrical access between the high voltage generation unit and the control end of the switch unit based on the first conduction control signal; and a second modification sub-unit, adapted for lowering the voltage of the second conduction control signal, when the first conduction control signal resides in the second signal period.

In some embodiments, the conduction control tube turns on when the first conduction control signal resides in the first signal period, such that the electrical access between the high voltage generation unit and the control end of the switch unit is formed, and the voltage of the second conduction control signal applied to the control end of the switch unit is identical to that of the erasing signal; and the conduction control tube turns off when the first conduction control signal resides in the second signal period.

In some embodiments, the conduction control tube may include: a fourth PMOS transistor, wherein a gate of the fourth PMOS transistor is coupled with the first conduction control signal, a source of the fourth PMOS transistor is coupled with the high voltage generation unit, and a drain of the fourth PMOS transistor is coupled with the control end of the switch unit; and the second modification sub-unit may include: a third NMOS transistor and a second capacitor, wherein a gate of the third NMOS transistor is coupled with the reference current generation unit, a source of the third NMOS transistor is grounded, and a drain of the third NMOS transistor is coupled with the drain of the fourth PMOS transistor, wherein a first end of the second capacitor is coupled with the drain of the fourth PMOS transistor and a second end of the second capacitor is grounded.

In some embodiments, the high voltage generation unit may be a charge pump.

Compared to prior art, embodiments of the present disclosure possess advantages: the voltage ascending process if the second conduction control signal is divided into the first signal period with a relatively low voltage and the second signal period with a relatively high voltage. When the first conduction control signal resides in the second signal period, the voltage of the second conduction control signal is lowered. As a result, the switch unit is switched on to form the electrical access between the high voltage generation unit and the output end of the circuit for erasing data. Therefore, voltage of the output signal from the circuit for erasing data is raised, so as to avoid a signal weakening problem of the output signal from the circuit for erasing data caused by increment of an induction threshold of a control tube in the lift unit. Since raising voltage of the erasing signal is not required, it is not needed to modify the high voltage generation unit, so as to relatively reduce area of a chip.

DETAILED DESCRIPTION

In a climbing signal generation circuit used for converting a high voltage erasing signal output from a charge pump into a voltage control signal with a relatively slow ascending speed, a startup voltage for a high voltage conduction tube coupled to the word lines becomes greater along with the increase of data erasing operations, leading to a drop of a maximum voltage output to the word lines, which affects the erasing effect. Conventionally, the erasing effect is improved by raising the voltage of the high voltage erasing signal. However, in this case, area of a high voltage generation unit generating the erasing signal is apparently enlarged, so that area occupied by the entire circuit is enlarged greatly.

Figure 1:
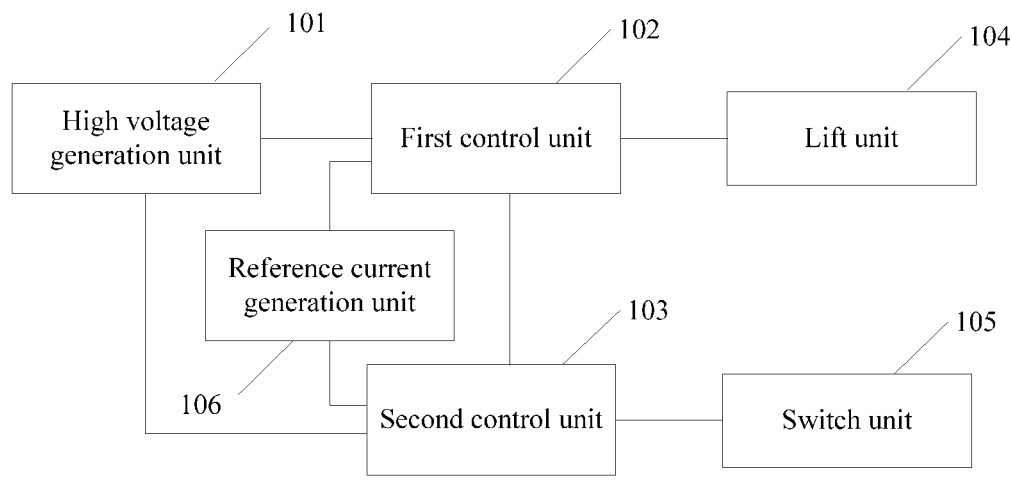
FIG. 1 schematically illustrates a block diagram presenting a circuit for erasing data according to one embodiment in the present disclosure.

Embodiments of the present disclosure provide a circuit for erasing data. Referring to FIG. 1, the circuit for erasing data may include: a high voltage generation unit 101, a first control unit 102, a second control unit 103, a lift unit 104, a switch unit 105 and a reference current generation unit 106.

Wherein, the high voltage generation unit 101 may be adapted for generating an erasing signal.

In some embodiments, the high voltage generation unit 101 may be a charge pump. The charge pump may release stored energy in a controlled way, so as to provide an erasing signal required to the circuit for erasing data.

The first control unit 102 may be adapted for modifying the erasing signal to a first conduction control signal with a decreased voltage ascending speed.

Figure 2:
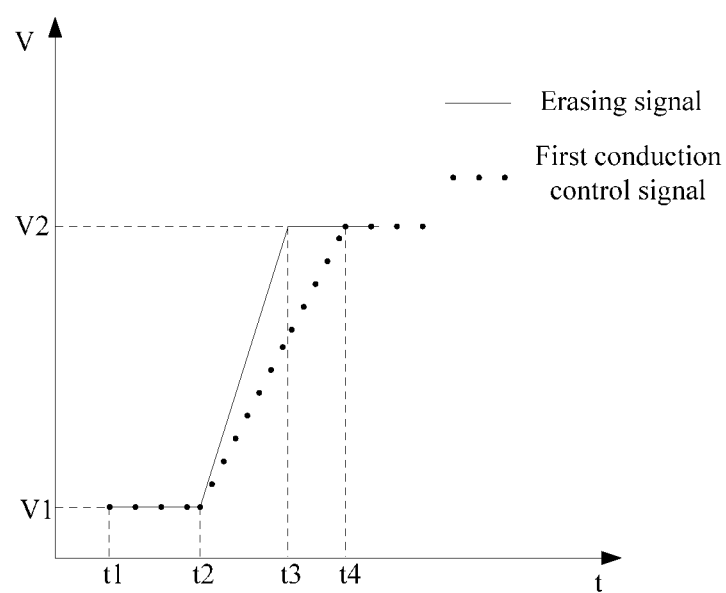
FIG. 2 schematically illustrates a diagram presenting an erasing signal and a first conduction control signal.

In some embodiments, the first control unit 102 may be a climbing signal generation circuit, which may be used for modifying an ascending speed of the erasing signal, so as to smooth an ascending slope of an output voltage of the circuit for erasing data. FIG. 2 schematically illustrates a diagram presenting an erasing signal and a first conduction control signal.

In some embodiments, the first control unit 102 may include: a reference current input sub-unit, a current mirror sub-unit and a first modification sub-unit. The reference current input sub-unit may be adapted for receiving a bias current generated by the reference current generation unit 106. The current mirror sub-unit may be adapted for mirroring the bias current to a small current that is smaller than the bias current. The first modification sub-unit may be adapted for generating the first conduction control signal based on the small current.

The second control unit 103 may be adapted for sending a second conduction control signal based on the first conduction control signal; when the first conduction control signal resides in a first signal period, voltage of the second conduction control signal may be identical to that of the erasing signal; and when the first conduction control signal resides in a second signal period, the voltage of the second induction control signal drops, where voltage of the first conduction control signal is less in the first signal period than in the second signal period.

In some embodiments, the second control unit 103 may include: a conduction control tube, adapted for forming an electrical access between the high voltage generation unit 101 and a control end of the switch unit 105 based on the first conduction control signal; a second modification sub-unit, adapted for lowering the voltage of the second conduction control signal, when the first conduction control signal resides in the second signal period.

The lift unit 104 may be adapted for lifting an output voltage at an output end of the circuit for erasing data based on the first conduction control signal.

In some embodiments, when the first conduction control signal resides in the first signal period that has a relatively low voltage, the circuit for erasing data may control the lift unit 104 to lift the output voltage at the output end of the circuit for erasing data based on the first conduction control signal. Since the first conduction control signal has a smaller ascending slope than the erasing signal, the output voltage at the output end of the circuit for erasing data may increases slowly relative to the erasing signal, so as to protect a storage unit.

The switch unit 105 may be adapted for, based on the second conduction control signal, forming an electrical access between the high voltage generation unit 101 and the output end of the circuit for erasing data.

In some embodiments, when the first conduction control signal resides in the second signal period that has a relatively high voltage, the second control unit 103 may turn on the switch unit 105 via the second conduction control signal, so as to conduct the high voltage generation unit 101 for forming the output end of the circuit for erasing data, so that the output voltage at the output end of the circuit for erasing data may raise, and the erasing effect may be improved.

The circuit for erasing data may control the lift unit 104 to lift the output voltage at the output end of the circuit for erasing data based on the first conduction control signal. Since the first conduction control signal has a smaller ascending slope than the erasing signal, the output voltage at the output end of the circuit for erasing data may increases slowly relative to the erasing signal.

The reference current generation unit 106 may be adapted for providing the bias current to the first control unit 102 and the second control unit 103.

From above, in the embodiments of the present disclosure, the second conduction control signal may be divided into the first signal period with a relatively low voltage and the second signal period with a relatively high voltage. When the first conduction control signal resides in the second signal period, by controlling the switch unit 105, the electrical access between the high voltage generation unit 101 and the output end of the circuit for erasing data may be formed, and voltage of the output signal from the circuit for erasing data may increase, so as to avoid a signal weakening problem of the output signal from the circuit for erasing data caused by increment of a induction threshold of a control tube in the lift unit 104. Since raising voltage of the erasing signal is not required, it is not needed to modify the high voltage generation unit 101, so as to relatively reduce area of a chip.

Figure 3:
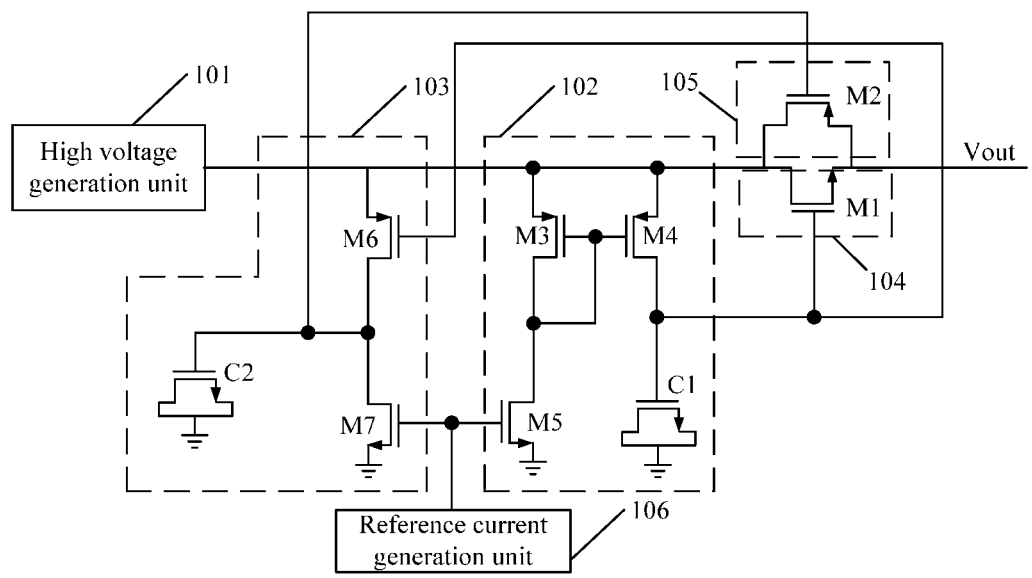
FIG. 3 schematically illustrates a structural diagram presenting a circuit for erasing data according to another embodiment in the present disclosure.

FIG. 3 schematically illustrates a structural diagram presenting a circuit for erasing data according to another embodiment in the present disclosure. Referring to FIG. 1 and FIG. 3, in the circuit for erasing data, the lift unit 104 may include a first NMOS transistor Ml; wherein, a gate of the first NMOS transistor M1 forms a control end of the lift unit 104, a source of the first NMOS transistor M1 is coupled with the output end Vout of the circuit for erasing data, and a drain of the first NMOS transistor M1 is coupled with the high voltage generation unit 101.

In some embodiments, the first NMOS transistor M1 may be a high voltage MOS tube.

The switch unit 105 may include a first PMOS transistor M2; wherein, a gate of the first PMOS transistor M2 forms the control end of the switch unit 105, a source of the first PMOS transistor M2 is coupled with the output end Vout of the circuit for erasing data, and a drain of the first PMOS transistor M2 is coupled with the high voltage generation unit 101. The first NMOS transistor M1 of the lift unit 104 is disposed in parallel to the switch unit 105.

In some embodiments, the first PMOS transistor M2 may be a high voltage MOS tube.

In the first control unit 102, the current mirror sub-unit may include a second PMOS transistor M3 and a third PMOS transistor M4, wherein a source of the second PMOS transistor M3 is coupled with the high voltage generation unit 101, a gate of the second PMOS transistor M3 is coupled with a gate of the third PMOS transistor M4, a drain of the second PMOS transistor M3 and the reference current input sub-unit, and a source of the third PMOS transistor M4 is coupled with the high voltage generation unit 101, a drain of the third PMOS transistor M4 is coupled with the first modification sub-unit and the control end of the lift unit 104.

In the first control unit 102, the first modification sub-unit may include a first capacitor Cl, where a first end of the first capacitor Cl is coupled with the drain of the third PMOS transistor M4 and a second end of the first capacitor C1 is grounded.

In some embodiments, the first capacitor C1 may be a high voltage MOS capacitor.

In some embodiments, the first capacitor Cl may have a volume of 0.5 pf.

In the first control unit 102, the reference current input sub-unit may include a second NMOS transistor M5, wherein a gate of the second NMOS transistor M5 is coupled with the reference current generation unit 106, a source of the second NMOS transistor M5 is grounded, and a drain of the second NMOS transistor M5 is coupled with the drain of the second PMOS transistor M3.

When the high voltage generation unit 101 outputs the erasing signal, the current mirror sub-unit in the first control unit 102 may mirror the bias current received by the reference current input sub-unit into the small current on another branch, where the small current may be smaller than the bias current, for example, mirror may be performed with a ratio of 2:1. The small current may charge the first capacitor C 1, so as to generate the first conduction control signal with a decreasing ascending speed relative to the erasing signal. In practical application, by modifying the small current used for charging the first capacitor C1 and modifying the first capacitor Cl, the ascending speed of the first conduction control signal may be further modified and controlled.

In the second control unit 103, the conduction control tube may include: a fourth PMOS transistor M6; wherein a gate of the fourth PMOS transistor M6 is coupled with the first conduction control signal, a source of the fourth PMOS transistor M6 is coupled with the high voltage generation unit 101, and a drain of the fourth PMOS transistor M6 is coupled with the control end of the switch unit 105.

In the second control unit 103, the second modification sub-unit may include: a third NMOS transistor M7 and a second capacitor C2; wherein a gate of the third NMOS transistor M7 is coupled with the reference current generation unit 106, a source of the third NMOS transistor M7 is grounded, and a drain of the third NMOS transistor M7 is coupled with the drain of the fourth PMOS transistor M6; wherein a first end of the second capacitor C2 is coupled with the drain of the fourth PMOS transistor M6 and a second end of the second capacitor C2 is grounded.

In some embodiments, the second capacitor C2 may be a high voltage MOS capacitor.

In some embodiments, the second capacitor C2 may have a volume of 0.2 pf.

Since the first conduction control signal have a smaller ascending speed than the erasing signal, when the first conduction control signal resides in the first signal period, the conduction control tube, namely the drain of the fourth PMOS transistor M6, may have a smaller voltage than the source of the fourth PMOS transistor M6, and difference between the drain and the source of the fourth PMOS transistor M6 may be greater than a conduction threshold of the fourth PMOS transistor M6, thus the fourth PMOS transistor M6 may be in a conduction state. At this moment, voltage of the gate of the first PMOS transistor M2 may be equal to the erasing voltage and greater than voltage of the drain of the first PMOS transistor M2, so that the first PMOS transistor M2 may be in a state of cut-off. At this moment, only the first control unit 102 may slowly lift the output voltage of the circuit for erasing data by controlling the lift unit 104.

Figure 4:
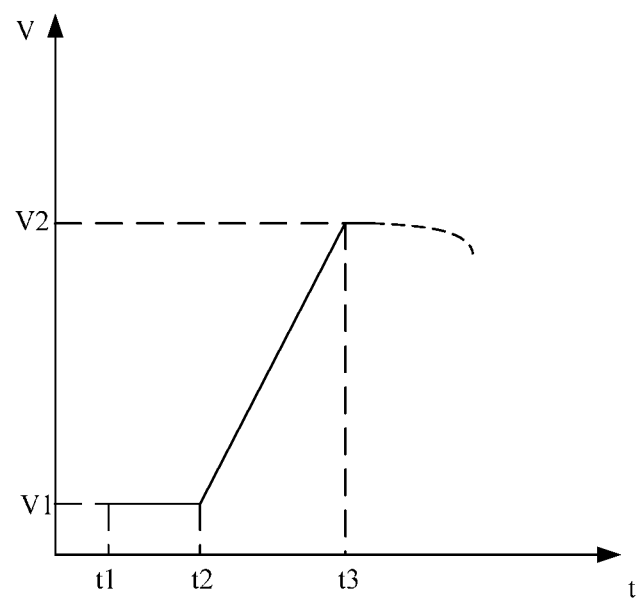
FIG. 4 schematically illustrates a diagram presenting a second conduction control signal.

When the first conduction control signal resides in the second signal period with a relatively high voltage, difference between voltage of the first conduction control signal received by the gate of the fourth PMOS transistor M6 and voltage of the erasing signal received by the source of the fourth PMOS transistor M6 may be smaller than the conduction threshold of the fourth PMOS transistor M6, so that the fourth PMOS transistor M6 may be in a state of cut-off at this moment. Simultaneously, the third NMOS transistor M7 may be in a state of conduction, thus the second conduction control signal is lowered. In some embodiments, via the second capacitor C2 discharges, a descending speed of the second conduction control signal is modified, as presented in a dash-line part shown in FIG. 4.

Since voltage of the second conduction control signal drops and the voltage at the output end Vout of the circuit for erasing data raises, the first PMOS transistor M2 may be in a state of conduction, when voltage of the source of the first PMOS transistor M2 is greater than the voltage of the gate of the first PMOS transistor M2 and difference between the voltage of the source and the voltage of the gate of the first PMOS transistor M2 is greater than a conduction threshold of the first PMOS transistor M2. Then, the high voltage generation unit 101 may directly output the voltage signal to the output end Vout of the circuit for erasing data, and the output voltage of the circuit for erasing data increases, so as to improve the erasing effect.

Components used in the embodiments of the present disclosure may be changed according to practical application. Any embodiment in accordance with the spirit of the embodiments of the present disclosure is in the scope of the present disclosure.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A circuit for erasing data, comprising:
   a high voltage generation unit, adapted for generating an erasing signal;
   a first control unit, adapted for modifying the erasing signal to a first conduction control signal with a decreased voltage ascending speed;
   a second control unit, adapted for sending a second conduction control signal based on the first conduction control signal, when the first conduction control signal resides in a first signal period, voltage of the second conduction control signal is identical to that of the erasing signal; and when the first conduction control signal resides in a second signal period, the voltage of the second induction control signal drops, where voltage of the first conduction control signal is less in the first signal period than in the second signal period;
   a lift unit, adapted for lifting an output voltage at an output end of the circuit for erasing data based on the first conduction control signal;
   a switch unit, adapted for, based on the second conduction control signal, forming an electrical access between the high voltage generation unit and the output end of the circuit for erasing data; and
   a reference current generation unit, adapted for providing a bias current to the first control unit and the second control unit.

2. The circuit for erasing data according to claim 1, wherein when the first conduction control signal resides in the first signal period, the voltage of the second conduction control signal is identical to that of the erasing signal, such that the switch unit is switched off, and the output voltage of the circuit provided by the lift unit has a voltage ascending speed slower than that of the erasing signal.

3. The circuit for erasing data according to claim 1, wherein when the first conduction control signal resides in the second signal period, the voltage of the second conduction control signal drops, such that the switch unit is switched on to form the electrical access between the high voltage generation unit and the output end of the circuit.

4. The circuit for erasing data according to claim 1, wherein the lift unit comprises a first NMOS transistor, wherein a gate of the first NMOS transistor forms a control end of the lift unit, a source of the first NMOS transistor is coupled with the output end of the circuit for erasing data, and a drain of the first NMOS transistor is coupled with the high voltage generation unit.

5. The circuit for erasing data according to claim 1, wherein the switch unit comprises a first PMOS transistor, wherein a gate of the first PMOS transistor forms a control end of the switch unit, a source of the first PMOS transistor is coupled with the output end of the circuit for erasing data, and a drain of the first PMOS transistor is coupled with the high voltage generation unit.

6. The circuit for erasing data according to claim 4, wherein the first control unit comprises: a reference current input sub-unit, adapted for receiving a bias current generated by the reference current generation unit; a current mirror sub-unit, adapted for mirroring the bias current to a small current; and a first modification sub-unit, adapted for generating the first conduction control signal based on the small current.

7. The circuit for erasing data according to claim 6, wherein the current mirror sub-unit comprises a second PMOS transistor and a third PMOS transistor, wherein a source of the second PMOS transistor is coupled with the high voltage generation unit, a gate of the second PMOS transistor is coupled with a gate of the third PMOS transistor, a drain of the second PMOS transistor and the reference current input sub-unit, wherein a source of the third PMOS transistor is coupled with the high voltage generation unit, a drain of the third PMOS transistor is coupled with the first modification sub-unit and the control end of the lift unit;

the reference current input sub-unit comprises a second NMOS transistor, wherein a gate of the second NMOS transistor is coupled with the reference current generation unit, a source of the second NMOS transistor is grounded, and a drain of the second NMOS transistor is coupled with the drain of the second PMOS transistor; and the first modification sub-unit comprises a first capacitor, where a first end of the first capacitor is coupled with the drain of the third PMOS transistor and a second end of the first capacitor is grounded.

8. The circuit for erasing data according to claim 7, wherein the small current flows from the third PMOS transistor to the first end of the first capacitor, so as to charge the first capacitor, during the charging process, voltage applied to the first end of the first capacitor gradually ascends, which forms the first conduction control signal.

9. The circuit for erasing data according to claim 1, wherein the second control unit comprises: a conduction control tube, adapted for forming an electrical access between the high voltage generation unit and the control end of the switch unit based on the first conduction control signal; and a second modification sub-unit, adapted for lowering the voltage of the second conduction control signal, when the first conduction control signal resides in the second signal period.

10. The circuit for erasing data according to claim 9, wherein the conduction control tube turns on when the first conduction control signal resides in the first signal period, such that the electrical access between the high voltage generation unit and the control end of the switch unit is formed, and the voltage of the second conduction control signal applied to the control end of the switch unit is identical to that of the erasing signal; and the conduction control tube turns off when the first conduction control signal resides in the second signal period.

11. The circuit for erasing data according to claim 9, wherein the conduction control tube comprises: a fourth PMOS transistor, wherein a gate of the fourth PMOS transistor is coupled with the first conduction control signal, a source of the fourth PMOS transistor is coupled with the high voltage generation unit, and a drain of the fourth PMOS transistor is coupled with the control end of the switch unit; and the second modification sub-unit comprises: a third NMOS transistor and a second capacitor, wherein a gate of the third NMOS transistor is coupled with the reference current generation unit, a source of the third NMOS transistor is grounded, and a drain of the third NMOS transistor is coupled with the drain of the fourth PMOS transistor, wherein a first end of the second capacitor is coupled with the drain of the fourth PMOS transistor and a second end of the second capacitor is grounded.

12. The circuit for erasing data according to claim 1, wherein the high voltage generation unit is a charge pump.

* * * * *